United States Patent
Luo et al.

(10) Patent No.: US 11,031,936 B1
(45) Date of Patent: Jun. 8, 2021

(54) HYBRID TRANSMITTER

(71) Applicant: NOVATEK Microelectronics Corp., Hsin-Chu (TW)

(72) Inventors: Ren-Hong Luo, Hsinchu (TW); Kun-Jui Shen, Taipei (TW); Ying-Cheng Lin, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/852,533

(22) Filed: Apr. 19, 2020

(51) Int. Cl.
*H03K 3/00* (2006.01)
*H03K 19/0185* (2006.01)

(52) U.S. Cl.
CPC ............................ *H03K 19/018514* (2013.01)

(58) Field of Classification Search
CPC .............................................. H03K 19/018514
USPC ......................................................... 327/108
See application file for complete search history.

(56) References Cited

U.S. PATENT DOCUMENTS

| | | | |
|---|---|---|---|
| 6,812,733 B1* | 11/2004 | Plasterer | H03K 3/356104 326/115 |
| 7,012,450 B1* | 3/2006 | Oner | H04L 25/0276 326/86 |
| 9,590,595 B2* | 3/2017 | Luo | H03K 19/017509 |
| 2008/0034378 A1* | 2/2008 | Kumar | G06F 13/4086 719/321 |
| 2015/0022243 A1* | 1/2015 | Wu | H04L 25/0272 327/108 |

* cited by examiner

*Primary Examiner* — Ryan Jager
(74) *Attorney, Agent, or Firm* — Winston Hsu

(57) ABSTRACT

A hybrid transmitter includes a current-mode driver, a voltage-mode driver and an auxiliary driver. The current-mode driver is configured to perform a current transmission. The voltage-mode driver is configured to perform a voltage transmission. The auxiliary driver, coupled to the current-mode driver and the voltage-mode driver, is configured to cooperate with the current-mode driver to enhance a driving capability of the current transmission and cooperate with the voltage-mode driver to enhance a driving capability of the voltage transmission.

7 Claims, 9 Drawing Sheets

HYBRID TRANSMITTER

BACKGROUND OF THE INVENTION

1. Field of the Invention

The present invention relates to a hybrid transmitter, and more particularly, to a hybrid transmitter capable of voltage-mode and current-mode transmissions.

2. Description of the Prior Art

There are two types of transmission schemes commonly used in an electronic system: voltage-mode transmission and current-mode transmission. The voltage-mode transmitter is composed of multiple resistors controlled by multiple switches. The resistance values of the resisters may determine the differential output voltages at the output terminals. In general, the voltage-mode transmission may have higher signal integrity. However, during the transient periods of state transition, switching of the switches may cause a shoot-through current passing through the resistors, reducing the power integrity of the transmitter.

On the other hand, the current-mode transmitter may be realized using current sources controlled by switches, to transmit currents to the differential transmission channels. The differential currents may generate a voltage difference on the termination resistor at the receiver side to achieve the signal transmission. Compared with the voltage-mode transmission, the current-mode transmission is much immune to power disturbance and thus has higher power integrity, but the signal integrity of the current-mode transmission is relatively weaker.

In many electronic systems, the voltage-mode transmission and the current-mode transmission functions are integrated into a transmitter to achieve higher performance of both signal integrity and power integrity. This transmitter may selectively perform the voltage-mode transmission or current-mode transmission based on requirements of power integrity and/or signal integrity. However, several problems arise with the integration of these two transmission schemes. For example, pre-emphasis scheme is usually applied to accelerate the signal swing and thereby improve the performance in a high speed transmission system. A pre-emphasis circuit may not be commonly used to support both of the voltage-mode transmission and the current-mode transmission. Thus, there is a need for improvement over the prior art.

SUMMARY OF THE INVENTION

It is therefore an objective of the present invention to provide a novel hybrid transmitter capable of voltage-mode transmission, current-mode transmission, and pre-emphasis functions, in order to solve the abovementioned problems.

An embodiment of the present invention discloses a hybrid transmitter, which comprises a current-mode driver, a voltage-mode driver and an auxiliary driver. The current-mode driver is configured to perform a current transmission. The voltage-mode driver is configured to perform a voltage transmission. The auxiliary driver, coupled to the current-mode driver and the voltage-mode driver, is configured to cooperate with the current-mode driver to enhance a driving capability of the current transmission and cooperate with the voltage-mode driver to enhance a driving capability of the voltage transmission.

Another embodiment of the present invention discloses a common-mode sense circuit for a transmitter. The common-mode sense circuit comprises a digital-to-analog converter (DAC), a counter, and a comparator. The counter is coupled to the DAC. The comparator comprises a first input terminal, a second input terminal and an output terminal. The first input terminal is coupled to the DAC. The second input terminal is coupled to a first driver of the transmitter. The output terminal is coupled to the counter. Wherein, the common-mode sense circuit is configured to generate a second common-mode voltage for a second driver of the transmitter according to a first common-mode voltage of the first driver.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
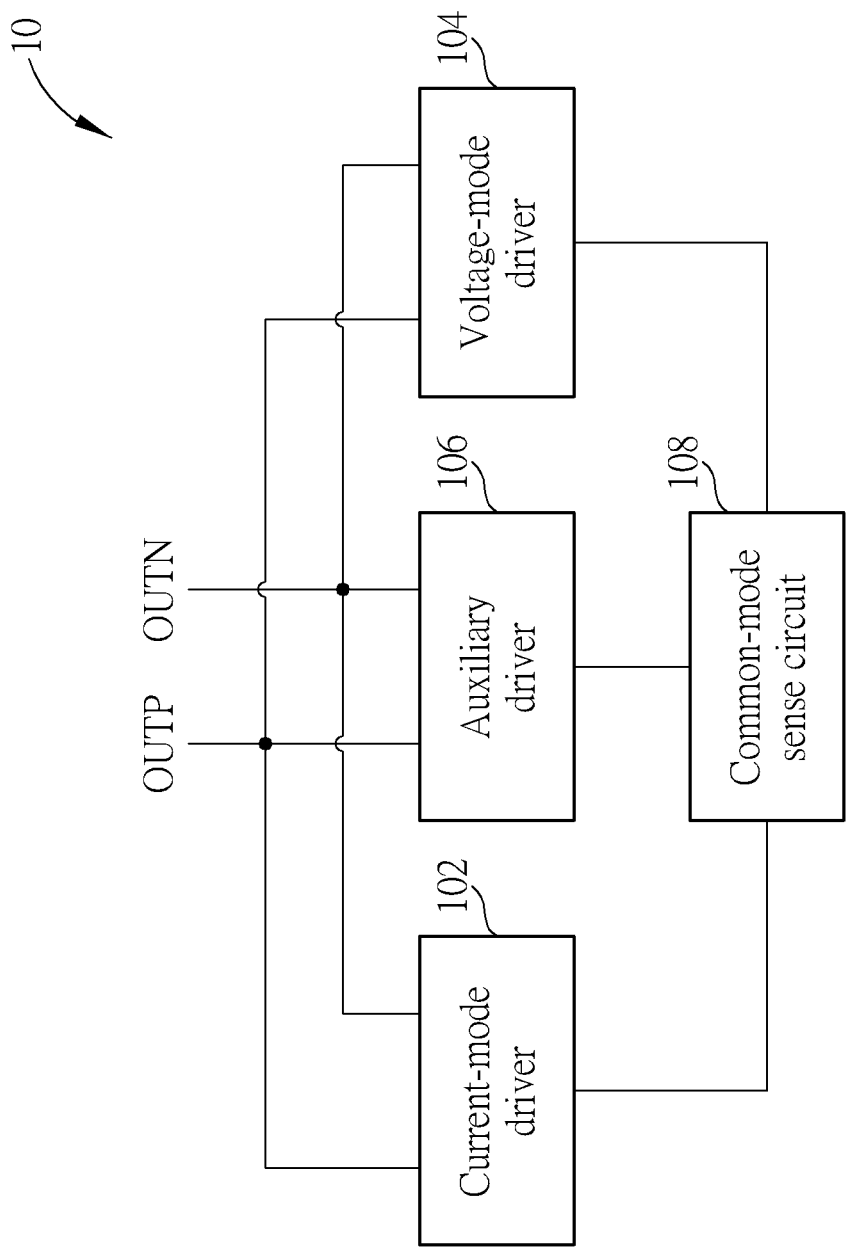
FIG. 1 is a schematic diagram of a transmitter according to an embodiment of the present invention.

Please refer to FIG. 1, which is a schematic diagram of a transmitter 10 according to an embodiment of the present invention. As shown in FIG. 1, the transmitter 10, as a hybrid transmitter, includes a current-mode driver 102, a voltage-mode driver 104, an auxiliary driver 106 and a common-mode sense circuit 108. The current-mode driver 102 is configured to perform a current transmission. For example, the current-mode driver 102 may be a low voltage differential signaling (LVDS) transmitter capable of transmitting currents to generate differential voltages OUTP and OUTN at the receiver side. The voltage-mode driver 104 is configured to perform a voltage transmission. For example, the voltage-mode driver 104 may be a pre-emphasis voltage-mode (PEVM) transmitter capable of generating and transmitting differential output voltages OUTP and OUTN to the receiver side. The auxiliary driver 106 is selectively coupled to the current-mode driver 102 or coupled to the voltage-mode driver 104. Under a voltage transmission, the auxiliary driver 106 may cooperate with the voltage-mode driver 104 to enhance the driving capability of the voltage transmission. Under a current transmission, the auxiliary driver 106 may cooperate with the current-mode driver 102 to enhance the driving capability of the current transmission. The common-mode sense circuit 108, which is coupled to the current-mode driver 102, the voltage-mode driver 104 and the auxiliary driver 106, is configured to control the common-mode voltages of the current-mode driver 102, the voltage-mode driver 104 and the auxiliary driver 106.

Figure 2:
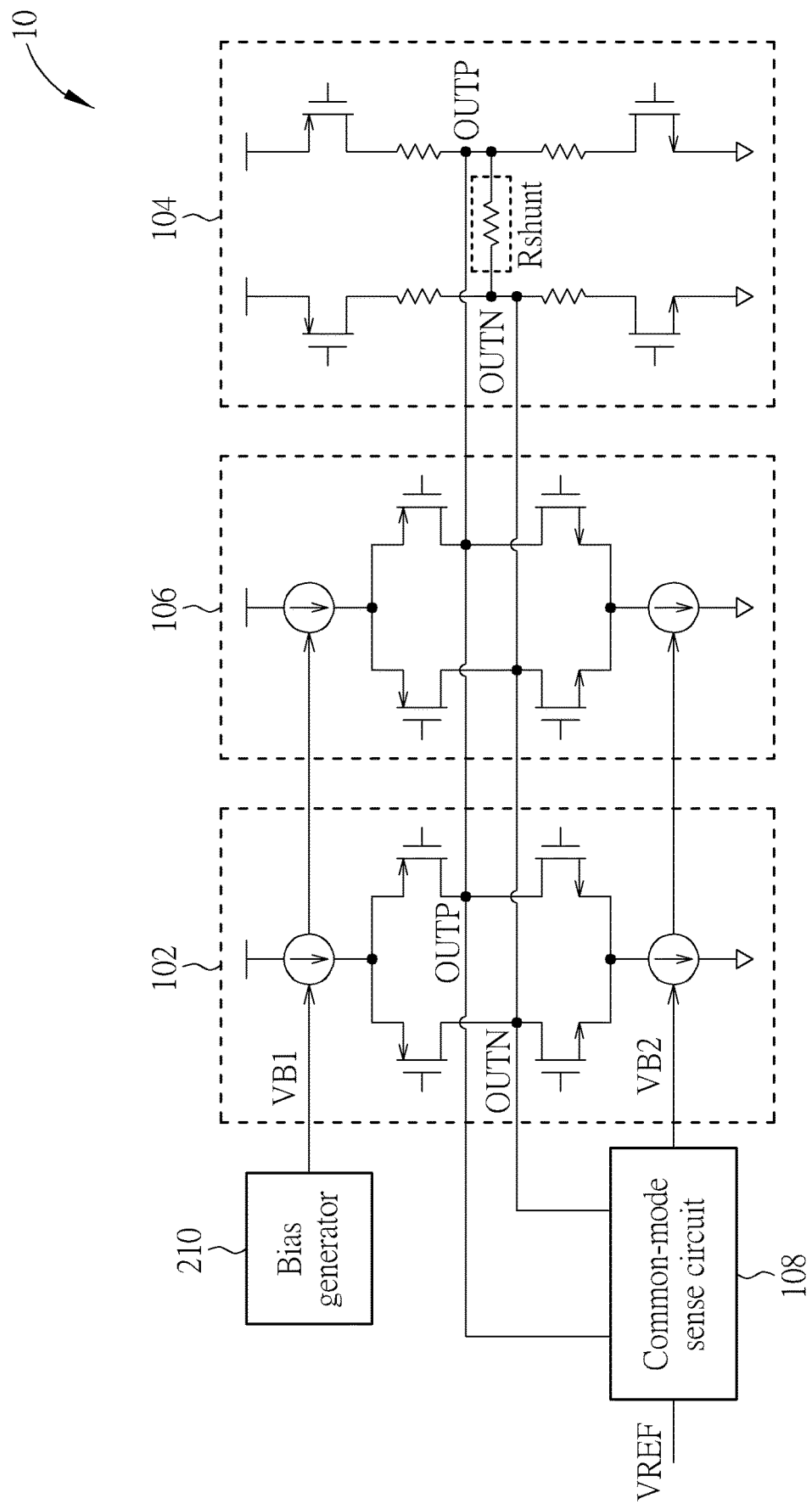
FIG. 2 is a schematic diagram of a detailed implementation of the transmitter shown in FIG. 1.

Please refer to FIG. 2, which is a schematic diagram of a detailed implementation of the transmitter 10 shown in FIG. 1. As shown in FIG. 2, the current-mode driver 102 is an LVDS transmitter composed of several transistors, a high-side current source and a low-side current source. A bias generator 210 is included in the transmitter 10, for outputting a bias signal VB1 to the high-side current source, in order to determine the current of the high-side current source. The low-side current source of the current-mode driver 102 may be controlled by the common-mode sense circuit 108. In general, the output currents of the current-mode driver 102 may generate differential output voltages OUTP and OUTN, and the common-mode sense circuit 108 may sense the output voltages OUTP and OUTN and output a bias signal VB2 to the low-side current source to determine the current value of the low-side current source. This current value allows the common-mode voltage (i.e., the average of the output voltages OUTP and OUTN) to be in an appropriate level. When the transmitter 10 is configured to perform a current transmission, the current-mode driver 102 may be turned on and the voltage-mode driver 104 may be turned off.

Figure 3:
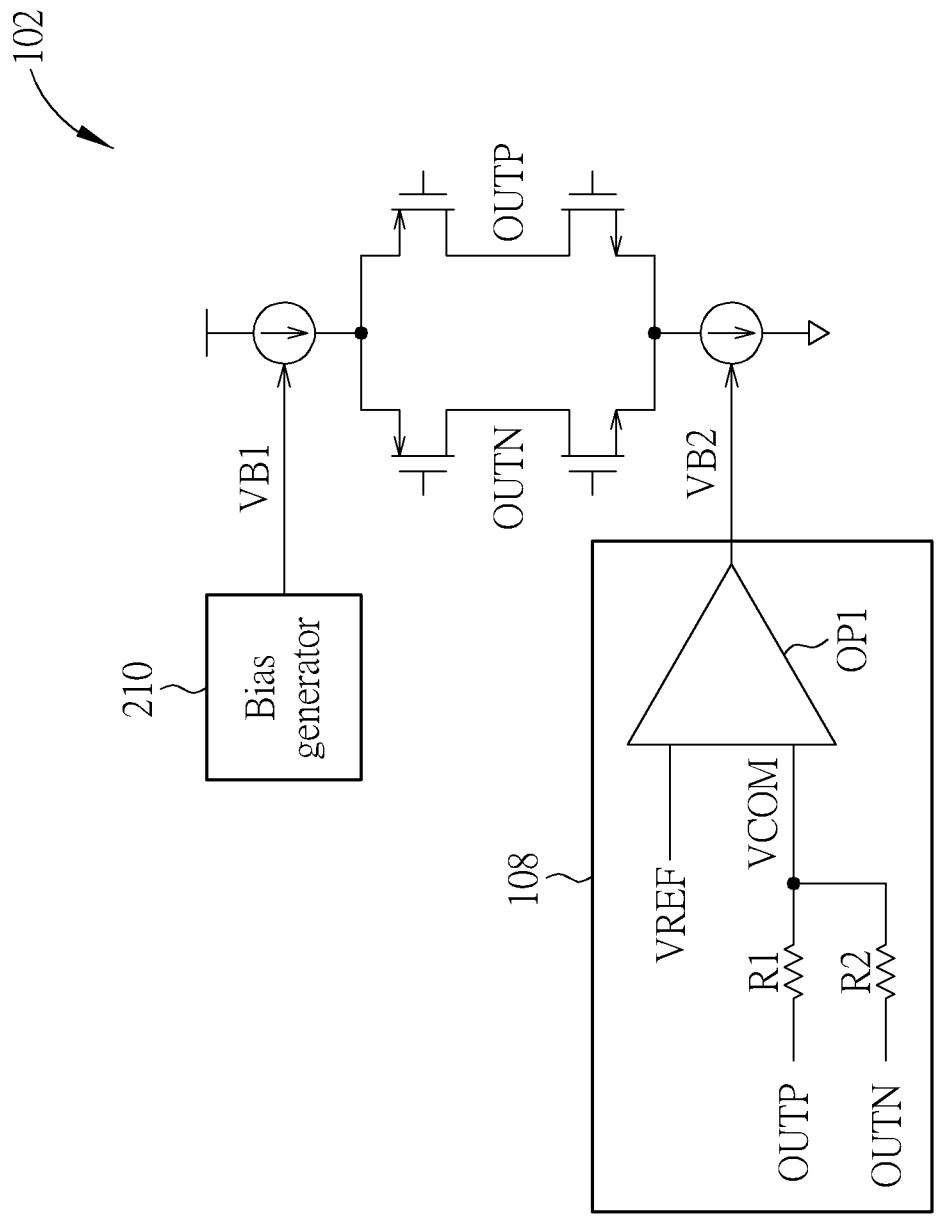
FIG. 3 illustrates a detailed structure of the common-mode sense circuit applicable to the current-mode driver.

FIG. 3 illustrates a detailed structure of the common-mode sense circuit 108 applicable to the current-mode driver 102. As shown in FIG. 3, the common-mode sense circuit 108 includes an operational amplifier OP1 and two resistor units R1 and R2. The resistor units R1 and R2 are coupled to the differential output terminals of the current-mode driver 102, for receiving the output voltages OUTP and OUTN, respectively, and thereby obtaining the common-mode voltage VCOM of the current-mode driver 102. Each of the resistor units R1 and R2 may include only one resistor or a combination of multiple resistors. The reference voltage VREF is a predetermined voltage. The operational amplifier OP1 may receive the common-mode voltage VCOM of the current-mode driver 102 and the reference voltage VREF, and output a bias signal VB2 to the low-side current source of the current-mode driver 102. With the common-mode feedback mechanism, the common-mode sense circuit 108 may control the common-mode voltage VCOM of the current-mode driver 102 to be equal to the reference voltage VREF, in order to control the common-mode voltage to a satisfactory level.

Please refer back to FIG. 2. The voltage-mode driver 104 is a PEVM transmitter composed of several resistors, two high-side transistors and two low-side transistors. The transistors operate as switches to control the current flowing through the shunt resistor Rshunt, so as to determine the differential output voltages OUTP and OUTN. For example, one of the high-side transistors may be turned on to form a pull-up path, and the low-side transistor in another branch is correspondingly turned on to form a pull-down path; hence, the differential output voltages OUTP and OUTN can thereby be generated. When the transmitter 10 is configured to perform a voltage transmission, the voltage-mode driver 104 may be turned on and the current-mode driver 102 may be turned off.

Figure 4:
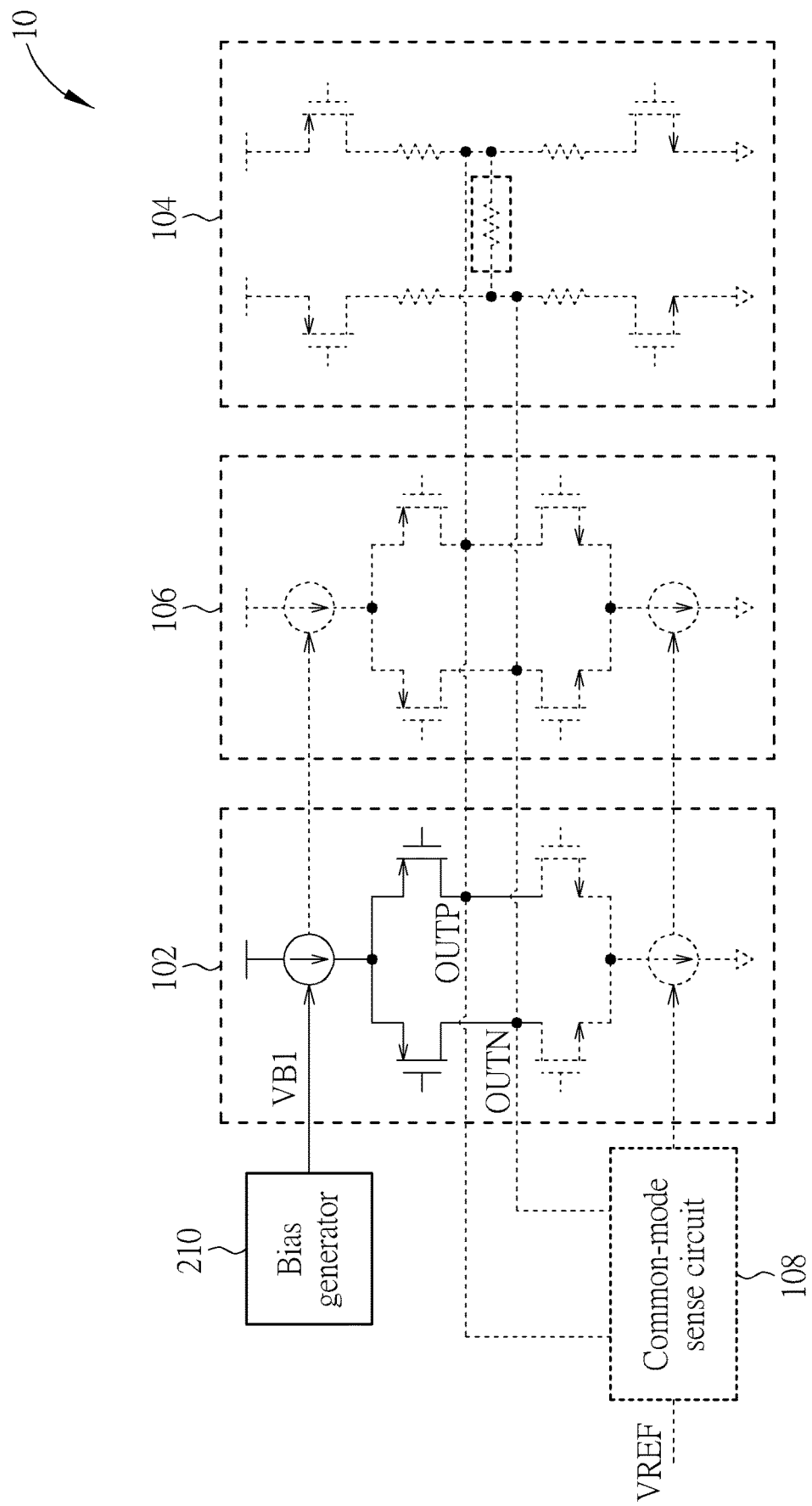
FIG. 4 illustrates an implementation of the transmitter that realizes the CML driver.

In an embodiment, the hybrid transmitter of the present invention may operate as a current-mode logic (CML) transmitter or driver. A CML driver may include only high-side devices or low-side devices, and the devices at the other side are realized with external resistor(s). FIG. 4 illustrates an implementation of the transmitter 10 that realizes the CML driver. As shown in FIG. 4, in the current-mode driver 102, if only the high-side current source and transistors are turned on (while the low-side devices are turned off), the current-mode driver 102 may operate as the CML driver. Alternatively, another CML driver may be realized by turning on the low-side devices while turning off the high-side devices. The CML driver may be applicable to high speed applications.

Please refer back to FIG. 2. The auxiliary driver 106 is composed of several transistors and current sources, as identical to the structure of the current-mode driver 102. As mentioned above, the auxiliary driver 106 may cooperate with the current-mode driver 102 and/or the voltage-mode driver 104 to enhance the driving capability of the current transmission and/or voltage transmission. During signal transition of the current-mode driver 102 or the voltage-mode driver 104, higher driving capability is required in order to accelerate the signal swing and improve the signal quality; hence, the auxiliary driver 106 may be turned on or enabled at this moment. The operation of applying the auxiliary driver 106 to enhance the driving capability during signal transition is the so-called "pre-emphasis" operation.

In this embodiment, the current-mode driver 102 and the voltage-mode driver 104 may share the same auxiliary driver 106; that is, the auxiliary driver 106 is configured to provide pre-emphasis for current transmission when cooperating with the current-mode driver 102, and configured to provide pre-emphasis for voltage transmission when cooperating with the voltage-mode driver 104.

Please continue to refer to FIG. 2. In the current-mode transmission with pre-emphasis, the current-mode driver 102 and the auxiliary driver 106 may be turned on while the voltage-mode driver 104 may be turned off. As shown in FIG. 2, the circuit structure of the auxiliary driver 106 is identical to the circuit structure of the current-mode driver 102; hence, the auxiliary driver 106 may operate similarly as the current-mode driver 102 under controls of the bias generator 210 and the common-mode sense circuit 108. In this embodiment, the common-mode sense circuit 108 may be configured to determine the common-mode voltage of the auxiliary driver 106 in addition to the common-mode voltage of the current-mode driver 102 according to the reference voltage VREF. The related operations are similar to those described in the previous paragraphs and will not be narrated herein.

In the voltage-mode transmission with pre-emphasis, the voltage-mode driver 104 and the auxiliary driver 106 may be turned on while the current-mode driver 102 may be turned off. The auxiliary driver 106 is configured to assist the voltage-mode driver 104 to realize the pre-emphasis function. However, the voltage-mode driver 104 may have a common-mode voltage determined based on the values of resistors, while the auxiliary driver 106 may have another common-mode voltage, which may be determined based on the reference voltage VREF as described above. If these two common-mode voltages have different values, an additional current may flow from one of the drivers to the other one, which breaks the balance of signal states and thereby influences the quality of signal transmission.

Figure 5:
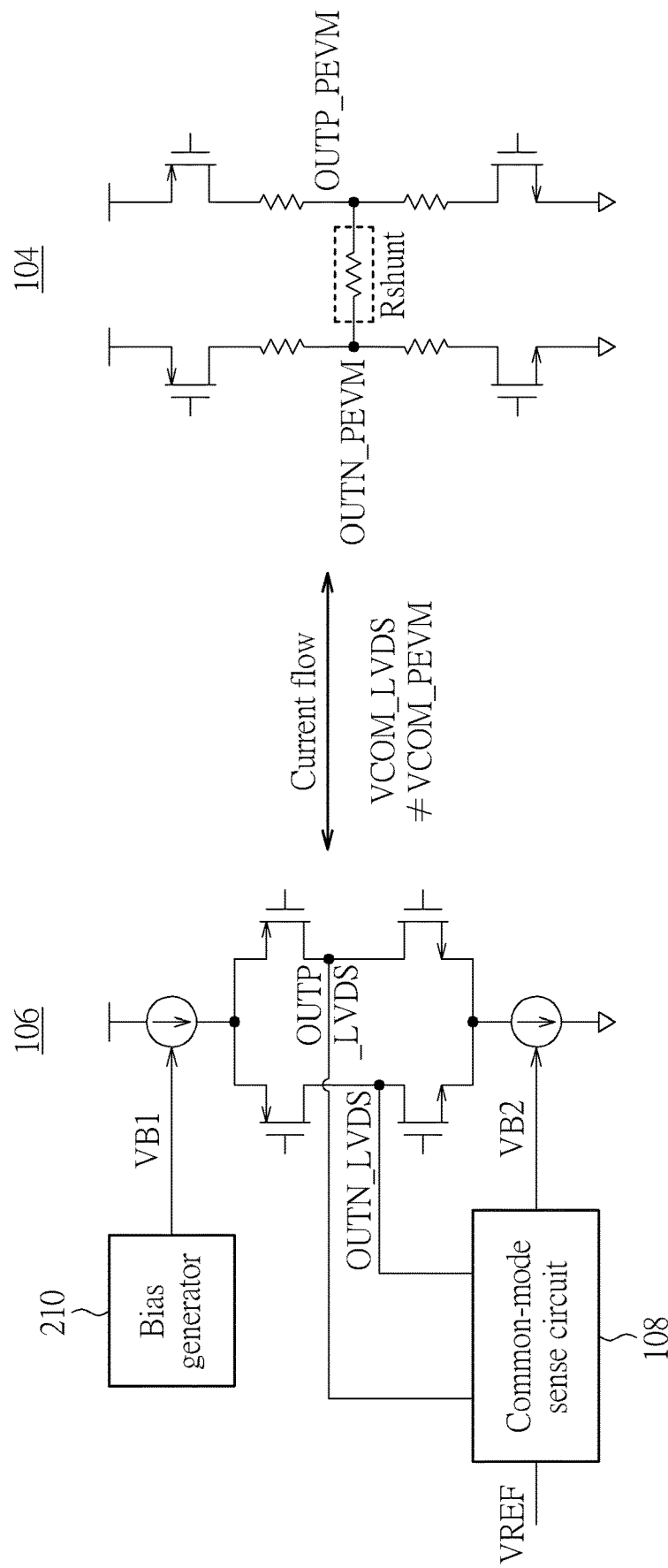
FIG. 5 is a schematic diagram of an unnecessary current flow between the auxiliary driver and the voltage-mode driver with unmatched common-mode voltages.

For example, please refer to FIG. 5, which is a schematic diagram of an unnecessary current flow (or backflow) between the auxiliary driver 106 and the voltage-mode driver 104 with unmatched common-mode voltages. As shown in FIG. 5, the voltage-mode driver 104 may have a common-mode voltage VCOM_PEVM (which may equal the average of the differential output voltages OUTP_PEVM and OUTN_PEVM). The common-mode voltage VCOM_PEVM may be determined from the values of the resistors, e.g., the ratio of the high-side resistance and the low-side resistance. The common-mode voltage VCOM_PEVM may be configured to have different values under different applications or requirements. The auxiliary driver 106 may also have a common-mode voltage VCOM LVDS (which may equal the average of the differential output voltages OUTP LVDS and OUTN LVDS). The common-mode voltage VCOM LVDS may be determined based on the reference voltage VREF received by the common-mode sense circuit 108. If the common-mode voltage VCOM LVDS of the auxiliary driver 106 is not equal to the common-mode voltage VCOM_PEVM of the voltage-mode driver 104, a current may flow between the auxiliary driver 106 and the voltage-mode driver 104, such that the quality of signal transmission may be influenced.

In order to prevent this problem, the common-mode voltage VCOM LVDS of the auxiliary driver 106 may be controlled or adjusted based on the common-mode voltage VCOM_PEVM of the voltage-mode driver 104. In an embodiment, the common-mode sense circuit 108 may be configured to generate the common-mode voltage VCOM LVDS for the auxiliary driver 106 according to the common-mode voltage VCOM_PEVM of the voltage-mode driver 104, allowing the common-mode voltage VCOM LVDS of the auxiliary driver 106 to be equal to the common-mode voltage VCOM_PEVM of the voltage-mode driver 104.

Figure 6:
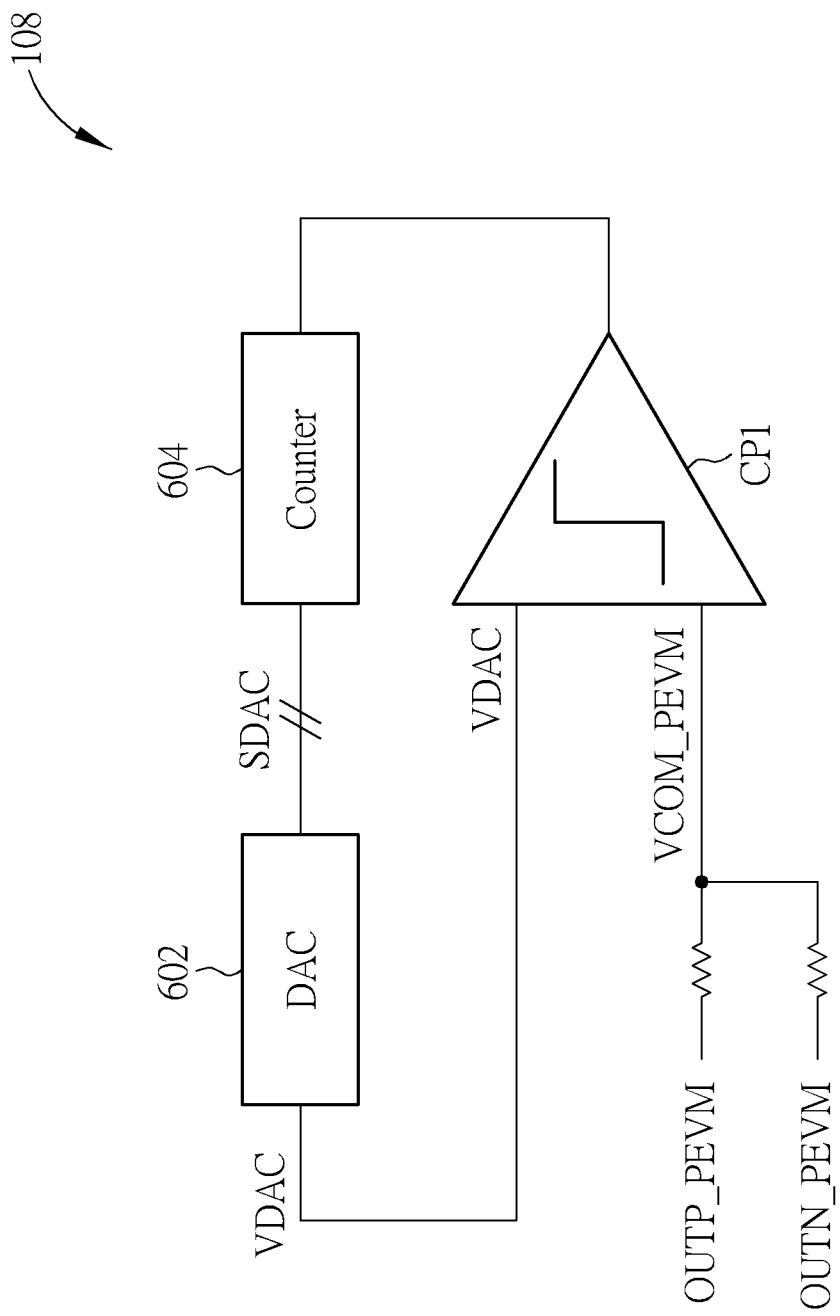
FIG. 6 is a schematic diagram of a detailed implementation of the common-mode sense circuit for realizing the matching of common-mode voltages.

Please refer to FIG. 6, which is a schematic diagram of a detailed implementation of the common-mode sense circuit 108 for realizing the matching of common-mode voltages. As shown in FIG. 6, the common-mode sense circuit 108 includes a digital-to-analog converter (DAC) 602, a counter 604 and a comparator CP1. When the auxiliary driver 106 cooperates with the voltage-mode driver 104, e.g., for performing pre-emphasis, the common-mode sense circuit 108 may obtain the common-mode voltage VCOM_PEVM of the voltage-mode driver 104, and thereby determine the common-mode voltage VCOM LVDS for the auxiliary driver 106 according to the common-mode voltage VCOM_PEVM of the voltage-mode driver 104.

In order to obtain the common-mode voltage VCOM_PEVM, the voltage-mode driver 104 may be enabled or turned on (while other drivers such as the current-mode driver 102 and the auxiliary driver 106 are disabled or turned off), so that the common-mode sense circuit 108 is able to obtain the differential output voltages OUTP_PEVM and OUTN_PEVM. In detail, the comparator CP1 may have an input terminal coupled to the voltage-mode driver 104, for receiving the average value of the differential output voltages OUTP_PEVM and OUTN_PEVM as the common-mode voltage VCOM_PEVM of the voltage-mode driver 104. Another input terminal of the comparator CP1 may be coupled to the DAC 602, for receiving the voltage VDAC of the DAC 602. The output terminal of the comparator CP1 may be coupled to the counter 604, and thus the comparison result of the comparator CP1 may be sent to the counter 604, instructing the counter 604 to increase or decrease its output signal SDAC. The DAC 602, which is coupled to the output terminal of the counter 604, may convert the received signal SDAC into the voltage VDAC. This feedback operation will be balanced if the value of the voltage VDAC becomes equal to the value of the common-mode voltage VCOM_PEVM. In such a situation, the common-mode sense circuit 108 may obtain the value of the common-mode voltage VCOM_PEVM. For example, the statuses of the DAC 602 and the counter 604 may be locked to record the information of the common-mode voltage VCOM_PEVM, which may be equal to the voltage VDAC.

Figure 7A:
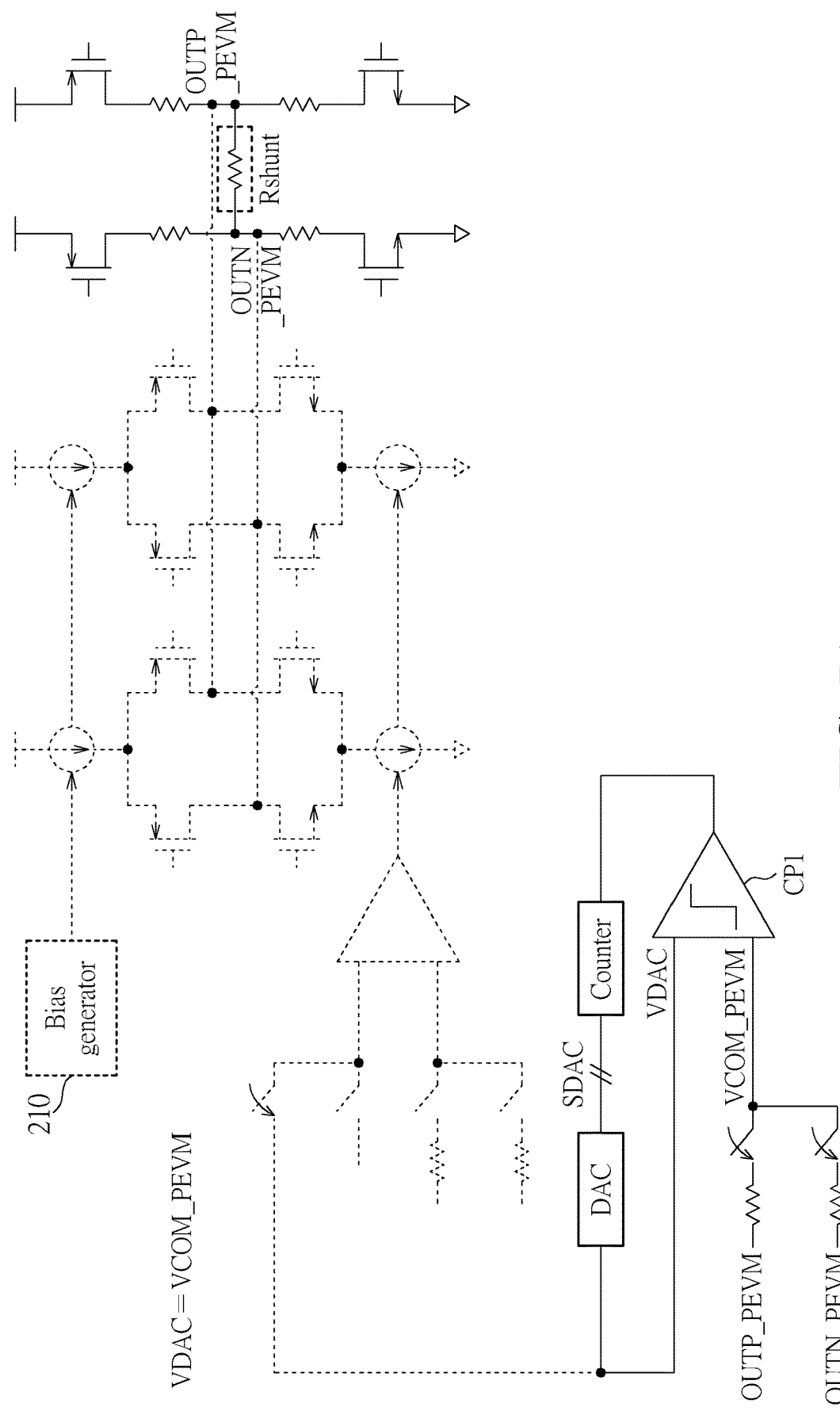
FIGS. 7A and 7B illustrate an implementation of the common-mode sense circuit for determining the common-mode voltage for the auxiliary driver according to the common-mode voltage of the voltage-mode driver.
Figure 7B:
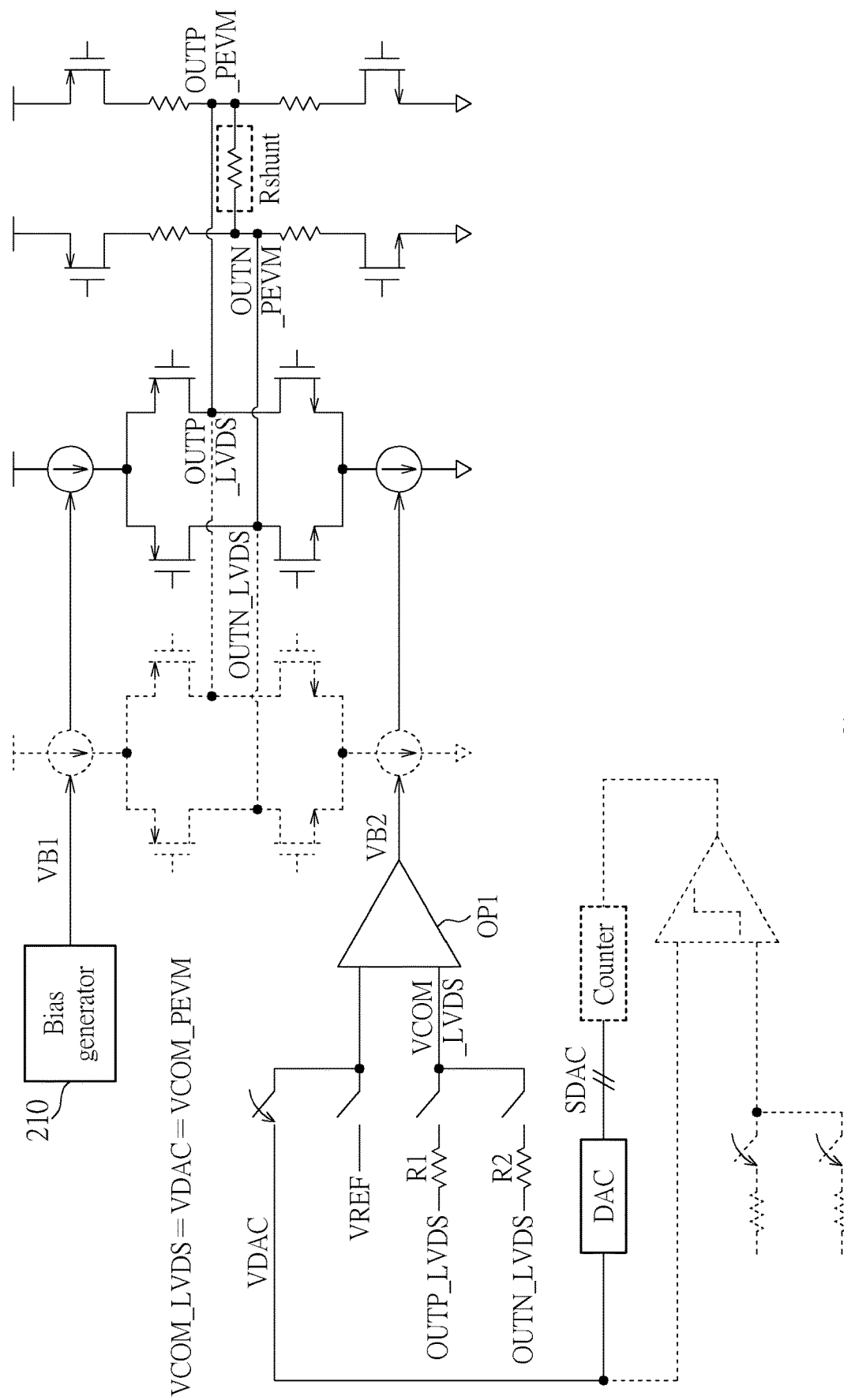

After the information of the common-mode voltage VCOM_PEVM is obtained, this information may be taken as a reference for determining the common-mode voltage VCOM LVDS for the auxiliary driver 106. In an embodiment, the circuit structure of the common-mode sense circuit 108 shown in FIG. 6 may be incorporated into the structure shown in FIG. 3, in order to determine the common-mode voltage VCOM LVDS for the auxiliary driver 106 according to the common-mode voltage VCOM_PEVM of the voltage-mode driver 104. FIGS. 7A and 7B illustrate an implementation of the common-mode sense circuit 108 for determining the common-mode voltage VCOM LVDS for the auxiliary driver 106 according to the common-mode voltage VCOM_PEVM of the voltage-mode driver 104. FIGS. 7A and 7B show the circuit structure of the common-mode sense circuit 108 as the structure of FIG. 3 combined with the structure of FIG. 6, and thus the related symbols of signals and elements are also incorporated therefrom.

In detail, FIG. 7A illustrates a detection phase, where the DAC 602, the counter 604 and the comparator CP1 are enabled to detect the common-mode voltage VCOM_PEVM of the voltage-mode driver 104. Afterwards, as shown in FIG. 7B, the auxiliary driver 106 starts to operate, and the voltage VDAC, which may be equal to the common-mode voltage VCOM_PEVM, is sent to the operational amplifier OP1 in the common-mode sense circuit 108; hence, the operational amplifier OP1 may output the bias signal VB2 to adjust a current value of the auxiliary driver 106, allowing the common-mode voltage VCOM LVDS of the auxiliary driver 106 to be equal to the voltage VDAC. In this manner, the voltage VDAC may be regarded as a reference (replacing the external reference voltage VREF applied in FIG. 3) to generate the output bias signal VB2 for common-mode voltage determination. In such a situation, the common-mode voltage VCOM LVDS of the auxiliary driver 106 may be equal to the common-mode voltage VCOM_PEVM of the voltage-mode driver 104. As a result, the auxiliary driver 106 may successfully cooperate with the voltage-mode driver 104 for pre-emphasis without additional current flow or backflow and unwanted interferences.

Please note that the embodiments of the present invention aim at providing a hybrid transmitter capable of voltage-mode transmission, current-mode transmission, and pre-emphasis functions applicable to both types of transmissions. Those skilled in the art may make modifications and alternations accordingly. For example, the circuit structures of the voltage-mode driver and the current-mode driver may be implemented in any possible manners, which should not be limited to those described in the present disclosure. As long as a transmitter having a voltage-mode driver, a current-mode driver, and an auxiliary driver, where voltage transmission and current transmission may be selectively performed and the auxiliary driver may be commonly used for both the voltage transmission and current transmission with an appropriate common-mode design, the transmitter should belong to the scope of the present invention. In the proposed hybrid transmitter, the user may determine to apply the voltage transmission or current transmission based on requirements of signal integrity and/or power integrity. With the abovementioned common-mode design technique, the auxiliary driver may be served as a pre-emphasis circuit for the voltage-mode driver when the voltage transmission is applied, and served as a pre-emphasis circuit for the current-mode driver when the current transmission is applied.

In addition, in an embodiment, a resistor of the voltage-mode driver may be applied as a termination resistor for the current transmission performed by the current-mode driver. This termination resistor may be combined with an external termination resistor to realize a double termination implementation, which may reduce signal reflection and thereby improve the signal integrity of the current transmission.

Figure 8:
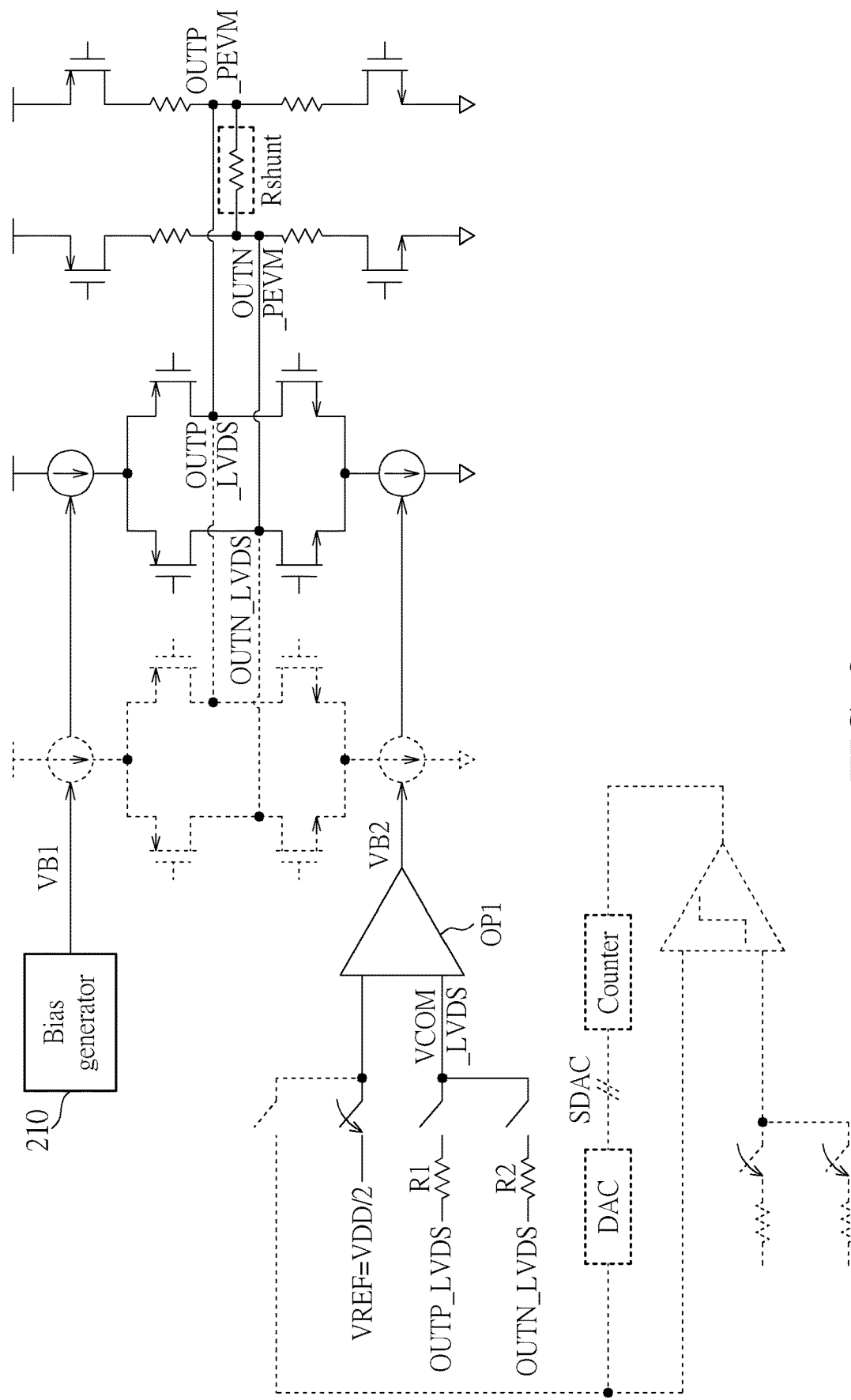
FIG. 8 is a schematic diagram of determining the common-mode voltage of the auxiliary driver according to the reference voltage having a value predetermined based on the common-mode voltage of the voltage-mode driver.

In another embodiment, the voltage transmission with pre-emphasis may be realized in another manner if the common-mode voltage of the voltage-mode driver is a known or predetermined value. For example, as shown in FIG. 8, if the common-mode voltage VCOM_PEVM has a predetermined value that equals one half of the power supply voltage VDD, the common-mode sense circuit 108 may not need to perform common-mode detection. Instead, the reference voltage VREF may be configured to be equal to VDD/2, and the operational amplifier OP1 may output the bias signal VB2 to adjust a current value of the auxiliary driver 106, allowing the common-mode voltage VCOM LVDS of the auxiliary driver 106 to be equal to VDD/2.

To sum up, the embodiments of the present invention provide a hybrid transmitter capable of voltage-mode transmission, current-mode transmission, and pre-emphasis functions applicable to both types of transmissions. The hybrid transmitter may include a current-mode driver such as an LVDS driver, a voltage-mode driver such as a PEVM driver, and an auxiliary driver. In the hybrid transmitter, voltage transmission and current transmission may be selectively performed according to system requirements. The auxiliary driver may cooperate with any of the current-mode driver and the voltage-mode driver, to realize the pre-emphasis function for both current transmission and voltage transmission. With an appropriate common-mode design technique, the common-mode voltage of the auxiliary driver may be equal to the common-mode voltage of the voltage-mode driver when the auxiliary driver cooperates with the voltage-mode driver. In an embodiment, a common-mode sense circuit of the hybrid transmitter may detect the common-mode voltage of the voltage-mode driver and determine the common-mode voltage for the auxiliary driver according to the common-mode voltage of the voltage-mode driver, allowing their common-mode voltages to be equal. As a result, the auxiliary driver may successfully cooperate with the voltage-mode driver for pre-emphasis without additional current flow or backflow and unwanted interferences due to unmatched common-mode voltages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A hybrid transmitter, comprising:
   a current-mode driver, configured to perform a current transmission;
   a voltage-mode driver, configured to perform a voltage transmission;
   an auxiliary driver, coupled to the current-mode driver and the voltage-mode driver, configured to cooperate with the current-mode driver to enhance a driving capability of the current transmission, and cooperate with the voltage-mode driver to enhance a driving capability of the voltage transmission; and
   a common-mode sense circuit, coupled to the voltage-mode driver and the auxiliary driver, configured to:
      detect a common-mode voltage of the voltage-mode driver; and
      determine a common-mode voltage for the auxiliary driver according to the common-mode voltage of the voltage-mode driver,
   wherein the common-mode sense circuit comprises:
      a digital-to-analog converter (DAC);
      a counter, coupled to the DAC; and
      a comparator, comprising:
         a first input terminal, coupled to the DAC;
         a second input terminal, coupled to the voltage-mode driver; and
         an output terminal, coupled to the counter.

2. The hybrid transmitter of claim 1, wherein the current-mode driver comprises a low voltage differential signaling (LVDS) transmitter.

3. The hybrid transmitter of claim 2, wherein the current-mode driver is configured to operate as a current-mode logic (CML) driver.

4. The hybrid transmitter of claim 1, wherein the voltage-mode driver comprises a pre-emphasis voltage-mode (PEVM) transmitter.

5. The hybrid transmitter of claim 1, wherein the common-mode sense circuit is configured to output a bias signal to the auxiliary driver to determine the common-mode voltage for the auxiliary driver.

6. The hybrid transmitter of claim 1, wherein the common-mode sense circuit is further configured to determine the common-mode voltage for the auxiliary driver and a common-mode voltage for the current-mode driver according to a reference voltage.

7. The hybrid transmitter of claim 1, wherein the auxiliary driver is configured to provide pre-emphasis for the current transmission when cooperating with the current-mode driver and provide pre-emphasis for the voltage transmission when cooperating with the voltage-mode driver.

* * * * *